United States Patent [19]
Currie et al.

[11] Patent Number: 5,986,291
[45] Date of Patent: Nov. 16, 1999

[54] FIELD EFFECT DEVICES

[75] Inventors: John F. Currie; Chetlur S. Sundararaman, both of Montreal, Canada

[73] Assignee: La Corporation de L'ecole Polytechnique, Quebec, Canada

[21] Appl. No.: 08/135,003

[22] Filed: Oct. 12, 1993

[51] Int. Cl.⁶ ............... H01L 31/0328; H01L 31/0336; H01L 31/072; H01L 31/109
[52] U.S. Cl. .......................................... 257/194; 257/192
[58] Field of Search ................................. 257/194, 192, 257/27

[56] References Cited

U.S. PATENT DOCUMENTS 4,468,851 9/1984 Wieder et al. ........................... 257/192
4,558,337 12/1985 Saunier et al. .
4,600,932 7/1986 Norris .
4,866,490 9/1989 Itoh .

*Primary Examiner*—Stephen D. Meier
*Attorney, Agent, or Firm*—Cantor Colburn LLP

[57] ABSTRACT

The channel region of the FET device has a first portion adjacent the source which has a higher bandgap energy or a higher electron affinity than a remaining portion of the channel. A quasi-electric field in the channel near the source is intensified and as a result, accelerates charge carriers in the channel and increases switching speed. An infrared controlled FET device is also disclosed in which a low bandgap channel layer has a large bandgap layer deposited on it to result in a conduction band discontinuity at the junction between the large bandgap semiconductor layer and the low bandgap channel layer and a two-dimensional electron gas (2DEG) channel in the low bandgap channel layer so that photons reaching the 2DEG eject charges and allow conduction through the channel layer.

25 Claims, 6 Drawing Sheets

20 : Region of low drift velocity

FIELD EFFECT DEVICES

BACKGROUND OF INVENTION

1. Field of the Invention

The novel invention relates to novel structures for Field Effect Transistors FETs, such as Heterojunction Insulated Gate FETs (HIGFETs) and Field Effect Infra-Red (FIRE) or FET IR detectors.

2. Description of Prior Art

HIGFET

The high mobility and large electron saturation velocities of compound semiconductors makes them attractive candidates for high speed and high frequency applications. In extremely small geometry devices the electrons are expected to experience collisionless ballistic transport through the active region of the device. This phenomenon is more easily observed in vertical heterojunction bipolar transistors (HBT) where the electrons enter the active region with considerable initial velocities. In HIGFETs, application of a suitable gate voltage lowers the semiconductor potential in the channel region under the gate region and causes electrons to be injected from the highly doped source into the channel. Transport occurs at the high mobility heterojunction interface and since the channel is completely undoped, scattering by ionized dopants is absent.

State-of-the-art Heterojunction FETs use a buried channel approach using epitaxial insulators, such as InAlAs or conventional dielectrics such as silicon nitride with a larger bandgap than the channel material, e.g. InGaAs. However, the forward gate-source breakdown voltage of epitaxially grown insulators is small, typically 1–1.25 volts, since the epitaxial insulators currently used have a much lower bandgap and resistivity compared to conventional dielectrics. Lattice matched or strained epitaxial growth of a high resistivity large bandgap material is a technological challenge and has not been adequately realized yet. There is also evidence that strain reduces the bandgap thereby further decreasing the confinement barrier. The lower barrier height will also limit the input gate voltage swing on enhancement type devices and restrict their high temperature operation. For these reasons, until a suitable high resistivity, large bandgap epitaxial insulator is developed there will also be interest in the use of conventional dielectrics for buried channel HIGFETs. Recently, Martin et al, reported a non-self-aligned buried channel HIGFET using $SiO_2$ as the gate insulator in "Undoped InP/InGaAs heterostructure insulated gate FET's grown by OMVPE with PECVD deposited $SiO_2$ as gate insulator", E. A. Martin, O. A. Aina, A. A. Iliadis, M. R. Mattingly and L. H. Stecker, IEEE Electron Device Lett. V9, pp. 500–503, 1988. These devices showed large transconductance due to carrier transport at the high mobility, buried heterojunction interface and a large allowable input voltage swing. However, a 20% drain current drive (DCD) over $10^4$ seconds at 300K and considerable hysterisis in the C-V characteristics indicate a significant amount of traps at the insulator/InP interface. Lowering the trap density at the top insulator/semiconductor interface will lower DCD and result in better modulation of the channel poteneial and increase the small signal response. In recent years interface passivation or interface control engineering is used to reduce the trap concentrations at the insulator/semiconductor interface. For example, Sulfur (S) passivation of the InP surface lowers the surface state density considerably by preventing the formation of Phosphorus (P) vacancies. This passivation process however is quite non-uniform and epitaxial passivation techniques can be used to improve uniformity.

In heterojunction FETs, numerical simulations indicate that the low electric field near the source region cause the electrons to enter the channel region with a low initial velocity and gradually accelerate towards the drain attaining the maximum drift velocity near the drain end of the channel. Device speed determined by the overall electron transit time of the channel region is therefore limited by the relatively slow electron drift velocity near the source region. This low field region limits performance in high frequency devices. Also, no effort has been made to date to improve the injection of carriers from the source region into the channel.

One of the objectives of the invention is to minimize these limitations by creating a built-in quasi field between the source and channel regions to speed up the electrons. An earlier approach to reduce transit time, uses a split gate to speed up the transistor (Ref: "Split gate field-effect transistor", M. Shur, Appl. Phys. Lett. V54, pp. 162–164, 1989). Here different voltages applied to two closely spaced gates changes the field distribution in the channel region. We present a new approach for a single gate FET, with a graded portion of the channel region near the source resulting in a large quasi-field near the source/channel junction. The field is used to launch the electrons at near saturation velocities into the channel region which would cause ballistic or quasi-ballistic transport depending on the device geometry. The field will also improve carrier injection from the source region.

Another objective of the invention is to use a thin epitaxial GaP passivation layer to reduce the interface state density in HIGFETs using conventional dielectrics and thereby increase the transconductance and frequency response of these devices.

FET Infra Red Detector

Conventional IR detectors use platinum silicide/p—Si Schottky barriers and narrow bandgap binary (e.g. InSb) or alloy semiconductors, (e.g. HgCdTe). Dark current is a reason for concern in both cases. The silicide/Si barrier height of 0.26 eV restricts the detector use to the 3–5 mm range while the breakdown field of narrow gap semiconductors is quite low. Materials technology and uniformity are rather difficult when narrow gap semiconductors are used. In addition these devices have to be cooled in order to minimize thermal excitation noise. The IR detector currently envisioned uses a large bandgap III–V semiconductor in contact with a smaller gap semiconductor. The latter layer has a larger electron affinity than the former and results in a conduction band discontinuity ($\Delta E_c$) at the heterojunction interface and confined quantum states resulting in a two dimensional electron gas in the smaller gap material. Device operation is similar to the silicide Schottky device where the electron gas acts as the metal and $\Delta E_c$ represents the Schottky barrier. The photons interacts with the electron gas to produce hot electrons which are emitted across the $\Delta E_c$ barrier into the larger gap material. Carrier emission is aided by the presence of the field perpendicular to the surface. By choosing different materials or with different alloy compositions we can alter $\Delta E_c$ and thereby the operating wavelength. The device will be controlled by a gate electrode that depletes the active area between the samples minimizing thermal excitation noise. Consequently, the device is expected to be operated without cooling or at temperatures higher than conventional IR detectors. Moreover since large bandgap semiconductors are used, breakdown voltages are high.

The III–V compound semiconductor technology that is used to fabricate these devices is quite mature and the fabrication complexity is moderate. However, to fabricate the graded source HIGFET devices we will resort to selective area epitaxy which is a field currently under intense investigation. The graded source FET and the infra-red detector closely resemble the FET structures that are already proven and used in optoelectronic integrated circuits (OEICs) and microwave integrated circuits. Using interface engineering strategies, the frequency and small signal response of these devices can be increased. One such technique that uses a thin epitaxial GaP layer is proposed along with the device structrues. These devices can be used for smart pixel imaging applications.

Heterojunction FET structures are known in the art as illustrated in, for example, U.S. Pat. Nos. 4,558,337, Saunier et al, Dec. 10, 1985, 4,600,932, Norris, Jul. 15, 1986 and 4,866,490, Itoh, Sep. 12, 1989.

The '337 patent teaches group III–V compound high electron mobility FETs. In FIG. 1 of the patent, the structure illustrated includes two heterojunctions; one inverted (between layers 17 and 19) and one normal (between layers 19 and 21). The inventive structure of FIG. 2 includes two normal heterojunctions.

In the '932 patent, an enhanced mobility buried channel transistor structure is described. Referring to FIG. 1, the layer 11 is a semi-insulating GaAs layer. On top of the layer 11 is an undoped layer 12 and on top of the layer 12 is a doped layer 13. As seen in FIG. 2B, the doping of layer 13 is tapered. An undoped layer 14 covers layer 13. This removes the 2DEG layer from the top surface of the structure to minimize long range coulomb interaction with ionized impurities and interface scattering.

A MESFET structure is taught in the '490 patent. As seen in FIG. 4, the inventive structure includes a GaAs semi-insulating layer 1, a high purity AlAs layer 42 and a high purity $Al_xGa_{1-x}As$ layer 49. The electrode affinity of the layer 49 is graded, as shown in FIG. 5, such that, at the junction of layers 42 and 49, x=1, and at the top of layer 49, x=0.

SUMMARY OF INVENTION
GRADED SOURCE HIGFET

The primary objective of the invention is to enhance the speed of the HIGFET by increasing the average carrier velocity in the channel region.

Another objective of the invention is to create a electric quasi built-in field at a first portion of the channel region near the source/channel junction of the transistor and thereby launch the carriers at near saturation velocities into the channel resulting in a ballistic or quasi-ballistic operation.

According to a specific aspect of the invention, a built-in voltage ramp with a quasi-field is created by composition-ally grading the channel region near the source/channel junction.

A further objective of the invention is to improve carrier injection from the source region into the channel by providing the aforementioned potential ramp.

A still further objective of the invention is to use epitaxial interface engineering techniques to reduce the interface state density and increase the transconductance of the HIGFETs.

According to the present invention, there is provided a heterojunction insulated gate field effect device which comprises a high resistivity III–V semiconductor substrate having a pair of opposed surfaces. An optional lattice matched buffer layer is epitaxially grown on one side of the substrate. A lattice matched or strained low bandgap high mobility epitaxial channel layer with a larger electron affinity than the buffer layer is deposited on top of the buffer layer. A large bandgap epitaxial barrier layer is grown on top of the channel layer. The barrier layer has a smaller electron affinity than the channel layer. A thin appropriate interface engineering epitaxial layer is grown on top of the barrier layer. An optional conventional dielectric id deposited onto the interfacial layer. A gate dielectric is deposited onto the final layer. Doped source and drain regions are formed on both sides of the channel forming region. A drain electrode and a source electrode are deposited onto the doped regions.

In accordance with another aspect of the invention, part of the channel region is graded near the source region by varying the composition in a linear fashion such that it decreases the electron affinity gradually from the source region towards the source/channel junction. The electron affinity at the source/channel junction is the lowest while the electron affinity on the other end of the graded region inside the channel is highest and is equal to the value of the channel material. This creates a built-in conduction band ramp that creates a quasi-field in the region of grading.

In accordance with certain specific features, the conduction band discontinuity ($\Delta E_c$) due to the electron affinity differences between the barrier and channel layers, confines the carriers in the channel region. When a suitable gate voltage is applied, carriers are injected from the source region into the channel region. The injected carriers will be accelerated by the quasi-field due to the source-channel junction to velocity saturation and emitted into the ungraded channel region. Depending on the channel length and the mean free path of the electrons the transport can be ballistic or quasi-ballistic. Importantly the transit time of the carriers through the device will be reduced resulting in fast switching and high frequency operation.

Furthermore, the use of a epitaxial interface engineering step is proposed to improve the electrical properties of the final interface and offer better uniformity. This can provide a semiconductor-conventional dielectric interface with low trap densities, improve the stress between dielectric and semiconductor, increase the metal semiconductor barrier, etc. Specifically use of a thin 30 Å GaP layer is proposed to prevent phosphorus (P) outdiffusion and the creation of surface P vacancies from InP barrier layers. This technique will be more uniform than the prior S passivation process.

In accordance with a particular embodiment of the invention there is provided a FET device, comprising; a source region; a drain region; a channel region interconnecting the source region and the drain region, and provided under a gate; the channel region comprising adjacent the source region a first portion having at least one of a higher bandgap energy and a lower electron affinity than a second portion extending between the first portion to the drain region, whereby a quasi electric field in the channel region near the source region is created in order to accelerate charge carriers and increase switching speed.

In accordance with a further specific embodiment of the invention there is provided a heterojunction insulated gate field effect transistor (HIGFET) comprising;

a high resistivity III–V semiconductor substrate having a pair of opposed surfaces;

a lattice matched or strained low bandgap high mobility epitaxial channel layer deposited on one surface of said substrate;

a large bandgap epitaxial barrier layer deposited on top of said channel layer;

an interface control layer on top of said barrier layer;

a gate electrode deposited on top of said interface control layer;

a doped source region and a doped drain region, said source and drain regions extending through said interface control layer, said barrier layer and into said channel layer and being separated from each other by a channel region in said channel layer;

a drain electrode connected to said drain region and a source electrode connected to said source region;

wherein said channel region comprises a first portion which is near said graded source to thereby provide a quasi-field near said source/channel junction.

FET IR Detector

The primary objective of this invention is to provide a field effect IR detector with large bandgap materials. Use of large bandgap materials will increase the breakdown voltage and operating temperature. Another objective is to operate the detector in a FET like fashion by providing gate, source and drain regions.

Another objective of the invention is to provide a small barrier for electrons by using the conduction band discontinuity $\Delta E_c$ at a heterojunction interface formed by the combination of large bandgap and small bandgap semiconductors with different electron affinities the two semiconductors having a large difference in mobilities.

Another objective of the invention is to use small and large bandgap semiconductors with a large mobility difference and thereby provide a channel with a differential mobility.

A further objective of the invention is to change the detection wavelength by changing the $\Delta E_c$ barrier height.

A still further objective is to excite the carriers from a two dimensional electron gas layer formed in the smaller gap material over the $\Delta E_c$ barrier into the large bandgap material. This causes carrier conduction in both layers.

A specific objective of this invention is that the parallel conduction in both layers with different mobilities will cause the drain current to change.

Another objective of the invention is to deplete the active region under the gate between samples reducing problems associated with thermal excitation.

Another objective is to enhance the detection by using quantum wells with large quantum mechanical reflection, from the channel interface opposite to the heterojunction interface and the use of multiple quantum wells.

According to the present invention, there is provided a heterojunction insulated gate field effect device which comprises of a high resistivity III–V semiconductor substrate having a pair of opposed surfaces. An optional lattice matched buffer layer is epitaxially grown on one side of the substrate. A lattice matched or strained low bandgap high mobility epitaxial 2DEG layer (a) with a larger electron affinity than the buffer layer is deposited on top of the buffer layer. A larger bandgap intermediate epitaxial layer (b) with much lower mobility is grown on top of the small bandgap layer (a). Layer (b) has a smaller electron affinity than the 2DEG layer (a). A large bandgap epitaxial barrier layer (c) is grown on top of layer (b). The barrier layer has a smaller electron affinity than layer (b). Multiple cycles of these layers can be used. A thin appropriate interface engineering epitaxial layer is grown on top of the final barrier layer. An optional conventional dielectric is deposited onto the interfacial layer. A gate electrode is deposited onto the final layer over the active region. Doped source and drain regions are formed on both sides of the active regions. A drain electrode and a source electrode are deposited onto the doped regions.

In accordance with another aspect of the invention, by applying a suitable gate voltage carriers are injected into layer (a) from the doped regions and form a 2DEG layer. When a drain voltage is applied, an appropriate drain current will flow. The device should be operated in the linear region to have a constant field in the channel region. The electron affinity difference between layer (a) and (b) leads to a $\Delta E_c$ barrier that confines most carriers in layer (a). Hot electrons are produced when the 2DEG electrons interact with the infrared photons. The hot electrons with energy higher than the $\Delta E_c$ heterojunction barrier are emitted from the high mobility layer (a) to the lower mobility layer (b) over the heterojunction barrier aided by the field in the perpendicular direction due to the gate voltage and thereby changing the relative electron concentrations in layers (a) and (b).

Furthermore, if the $\Delta E_c$ barrier between layer (b) and layer (c) is much larger than that between layer (a) and (b), the emitted carriers will be confined to layer (b) without further spillover. The relative electron concentrations between layers (a) and (b) will depend on the intensity of the IR radiation. The large mobility difference between layers (a) and (b) will cause the drain current to change and the variation is detected. The gate can also be used to control the sampling rate. An appropriate gate voltage will deplete the active region between samples thereby reducing problems with thermal excitation noise (the dark current).

Furthermore, by changing the $\Delta E_c$ barrier height, the operating wavelength can be changed. By using quantum wells for layer (a), the quantum mechanical reflection from layer (a)–layer (c) interface can be increased (the absorption co-efficient can be increased). Use of multiple cycles of layers (a), (b) and (c) will improve the detection sensitivity of the device. Since large bandgap materials are used the breakdown voltage is high.

In accordance with a particular embodiment of the invention, there is provided a FET IR device comprising: a source region; a drain region; a low bandgap channel layer interconnecting the source region and the drain region, and provided under a gate; wherein a large bandgap semiconductor layer is deposited on the channel layer; the low bandgap channel layer having a larger electron affinity than the large bandgap semiconductor layer to thereby result in a conduction band discontinuity ($\Delta E_c$) at the junction between the large bandgap semiconductor layer and the low bandgap channel layer and a two-dimensional electron gas (2DEG) channel in the low bandgap channel layer; the 2DEG being arranged to be reached by photons for controlling switching and said large bandgap semiconductor layer having a lower mobility than the low bandgap layer, whereby the electric field moves charges ejected by the photons from said 2DEG to the large bandgap channel layer enabling the latter to conduct.

In accordance with a further particular embodiment of the invention there is provided a field effect IR detector (FIRE) comprising:

a substrate having a pair of opposed surfaces;

a low bandgap 2DEG layer overlying said substrate;

a larger bandgap intermediate layer overlying said low bandgap layer;

a large bandgap barrier layer overlying said intermediate layer;

a passivation layer overlying said barrier layer;

an optional dielectric layer overlying said passivation or barrier layer;

a gate electrode deposited on said passivation or said dielectric layer;

doped source and drain regions disposed at either ends of said low bandgap layer, said intermediate bandgap layer and said barrier layer;

a drain electrode in electrical contact with said drain region and a source electrode in electrical contact with said source region.

BRIEF DESCRIPTION OF DRAWINGS

The invention will be better understood by an examination of the following description, together with the accompanying drawings, in which.

DESCRIPTION OF PREFERRED EMBODIMENTS

Figure 1:
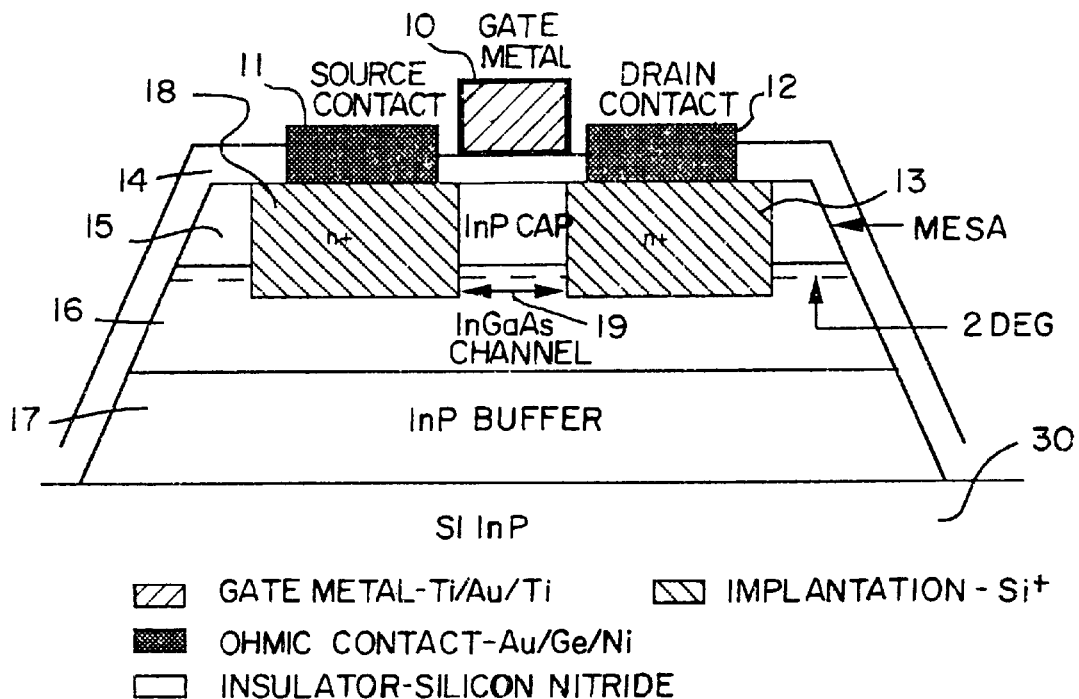
FIG. 1 is a cross-sectional view of the HIGFET in the prior art.

FIG. 1 shows a cross-section of a HIGFET in the prior art. The device consists of an optional buffer layer 17 deposited onto a semi-insulating (SI) substrate 30. A high mobility channel layer 16 is deposited epitaxially onto the buffer layer 17 or, if there is no buffer layer, onto the substrate 30. A large bandgap epitaxial barrier layer 15 is deposited onto the channel layer 16. An optional conventional dielectric layer 14 is deposited onto the barrier layer 15, and a metal gate 10 is deposited onto the barrier layer 15 or the dielectric layer 14 over the channel region 19. Doped source 18 and drain 13 regions are formed on both sides of the channel region 19 and source/drain contacts 11/12 are formed onto the doped regions 18/13.

Figure 2:
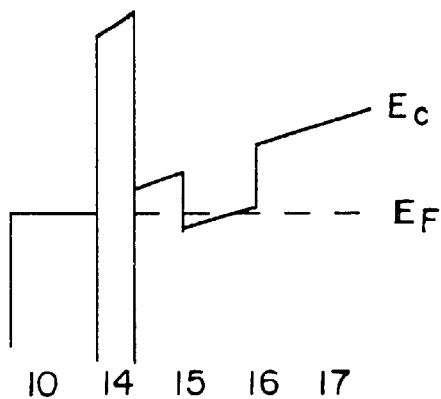
FIG. 2 is a schematic of the steady state conduction band edge energy band diagram from the gate electrode to the substrate for the HIGFET in the prior art.

FIG. 2 shows the equilibrium conduction band edge energy band diagram from the gate electrode to the substrate for the HIGFET in the prior art. The conduction band edge of the channel layer 16 is closest to the Fermi level ($E_F$), and the channel layer 16 has the lowest potential. As a result, when the device is ON, carriers are injected from the doped source region 18 into the high mobility channel region 19.

Figure 3:
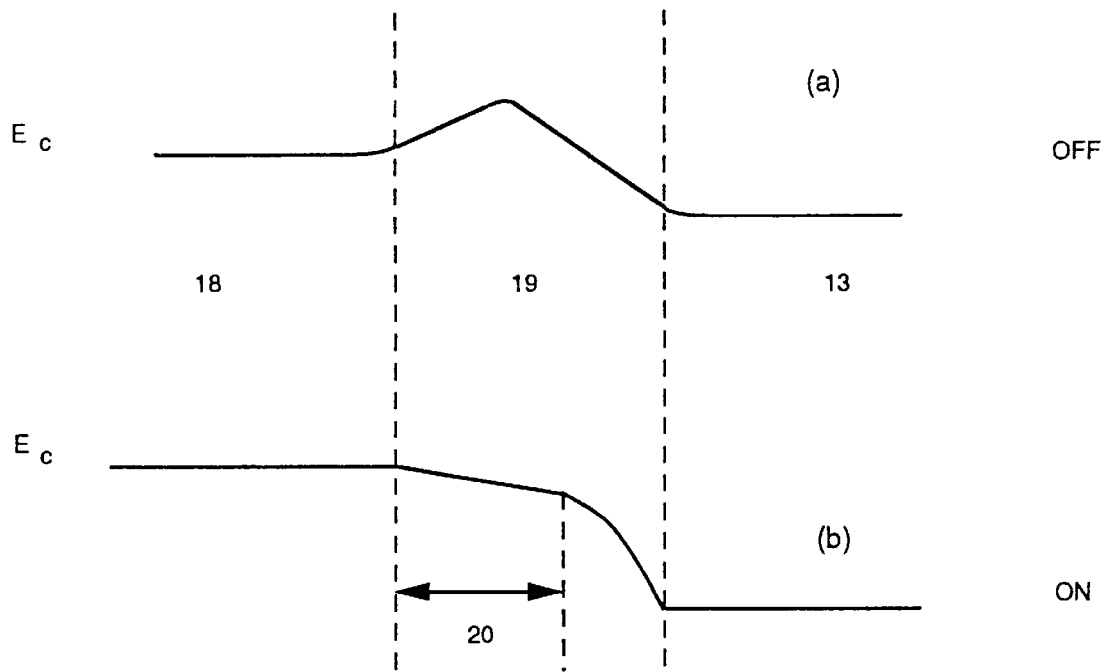
FIG. 3 is a schematic of the steady state conduction band edge energy diagram along the channel from the doped source region to the doped drain region for the device in the prior art when a) the device is in the OFF state ($V_G<V_T$) and b) the device is in the ON state ($V_G>V_T$) with an appropriate drain voltage.

FIG. 3 is a schematic of the steady state conduction band edge diagram along the channel from the doped source region 18 to the doped drain region 13 for the device in the prior art when a) the device is in the OFF state ($V_G<V_T$) and b) the device is in the ON state ($V_G>V_T$) with an appropriate drain voltage. In FIG. 3A, the gate voltage creates a barrier for the carrier injection. As a result, no current flows and the device is in the OFF state. When a suitable gate voltage is applied, the barrier is lowered and charge is injected into the channel layer in the channel region and the charge carriers flow from source to drain and the device is ON. However, the device in the prior art has a drawback as most of the drain voltage is dropped near the drain end of the channel. The smaller drop over the rest of the channel results in a small field near the source end of the channel and the carrier velocity is low in this region of the channel. The device speed is therefore determined by the transit time of the carriers in the low field region. The present invention enhances the carrier velocity in the near source region of the channel by accelerating the carriers by a large built-in quasi-field.

Figure 4:
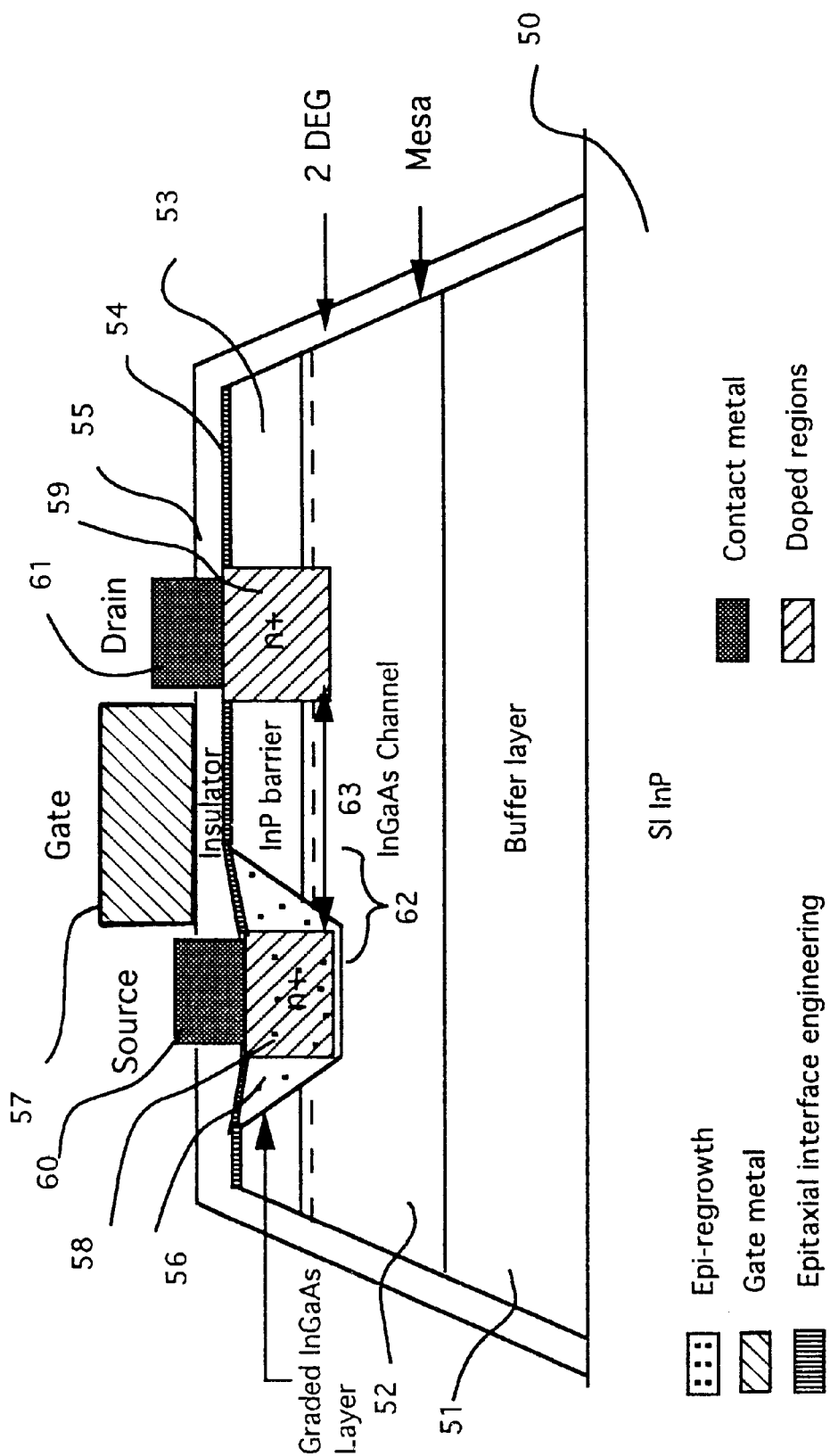
FIG. 4 is a cross-sectional view of the GRADED CHANNEL HIGFET according to the first embodiment of the present invention.

FIG. 4 shows the cross-section of the proposed HIGFET having a graded portion of its channel region near its source region. The device consists of:

a) A semi-Insulating (SI) InP substrate (50).
b) A high resistivity larger bandgap, e.g. InAlAs, lattice matched buffer layer (51).
c) A lattice matched high mobility smaller bandgap e.g. InGaAs, undoped channel layer (52).
d) A high resistivity larger bandgap lattice matched or strained insulator layer (53).
e) An epitaxially regrown graded undoped InGaAs portion of the channel region (56).
f) An interface control layer, e.g., 20 Å GaP layer (54).
g) An optional dielectric, e.g. SiO$_2$ layer (55).
h) Highly doped (n$^+$) implanted source and drain regions (58 and 59).
i) A refractory metal gate (57) e.g. W, Ti, Pt ovelapping the channel region (56).
j) Contacts to the implanted regions (60 and 61), e.g., Au/Ge/Ni.
k) Mesa device isolation (Mesa).

Figure 5:
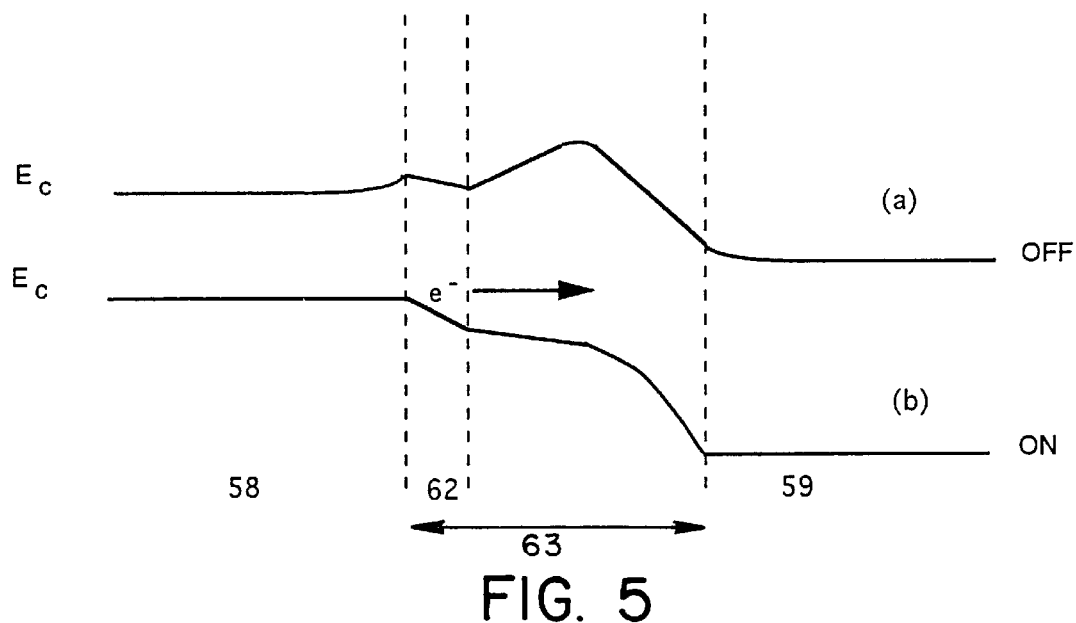
FIG. 5 is a schematic of the steady state conduction band edge energy diagram along the channel from the doped source region to the doped drain region of the Graded CHANNEL HIGFET according to the first embodiment of the present invention when a) the device is in the OFF state (($V_G<V_T$) and b) the device is in the ON state ($V_G>V_T$) with an appropriate drain voltage.

As mentioned above, the In$_{l-x}$Ga$_x$As channel region 62 is graded from the lattice match value of x=0.47 to larger x which will result in a conduction band ramp as shown in FIGS. 5a and 5b. This ramp creates a built-in quasi-electric field in the near source region. The magnitude of this field can be adjusted by changing the amount of grading and the grading length. For example, a 0.1 eV grading over a length of 200 Å would create a quasi-electric field of 50 KV/cm which is much larger than the field required for velocity saturation. The field in the near source region is therefore changed and the potential drop in the channel region will be made more uniform. Carriers entering the channel region from the source will be accelerated by the quasi-field to velocity saturation and injected into the ungraded portion of the channel region. The graded region therefore serves as a launching ramp for the carriers. The velocity saturated hot carriers can travel the channel region ballistically and reduce the channel transit time resulting in faster switching. This potential ramp will also enhance the source injection and lead to higher operating frequencies. Carrier relaxation is decided by the mean free path of the electrons and since the channel is undoped the mean free path of the electrons is quite large and may approach the channel length. Thus in short channel devices with channel lengths smaller than the electron mean free path, transport will be ballistic. In relatively long channel devices, the carriers further from the source will relax to lower velocities due to the presence of a smaller local field and result in quasi-ballistic transport. These carriers can be speeded up by suitably placing another potential step further down the channel.

Device fabrication would involve the following steps:
1) Cleaning of the semi-insulating (SI) substrate 50.
2) Epitaxial growth of the channel 52 and the cap layer 53 (optionally, a buffer layer 51 can be grown on substrate 50, and channel layer 52 grown on buffer layer 51).
3) Indirect plasma deposition of a silicon oxide or nitride protective dielectric layer 55.
4) Lithography to define the regrowth region 56 followed by a selective oxide/nitride etch in hydrofluoric acid and a shallow window etch using 3–5% iodic acid which is stopped in the channel layer.
5) Epitaxial window regrowth to form the graded portion of the channel region 56 to completely regrow the etched window.
6) Removal of the protective nitride layer of step 3 with a hydrofluoric acid etch.
7a) A polishing cleaning cycle.
7b) An optional planarizing etch which also removes the cap layer 53 and regrowth of the cap epi-layer.
8) Following a lithography step which defines the active device area, device isolation using a mesa etch with 10% iodic acid or a proton implantation step.
9) Lithography to define the source and drain regions and a selective $^{29}Si^+$ implantation at room temperature or at higher temperature e.g. 100–200° C.
10) A mild etch to delineate the implanted regions for alignment purposes for non-self aligned devices.
11) Implant activation of 800° C. for 10 seconds or in the case of self-aligned FETs at 700° C. for 4–10 seconds by slow ramp anneal sequence.
12) Surface cleaning and epitaxial passivation using a technique such as growth of a thin 20 Å strained epitaxial GaP layer 54, etc.
13) Indirect plasma dielectric, e.g., $SiO_2$, $Si_3N_4$, $SiN_xO_y$, $InP_xO_y$, etc., layer 55 deposition.
14) Lithography followed by gate metal lift-off.
15) Lithography to define contact regions, an insulator etch followed by Au/Ge/Ni contact deposition and lift-of to directly contact the InGaAs channel.

Figure 6:
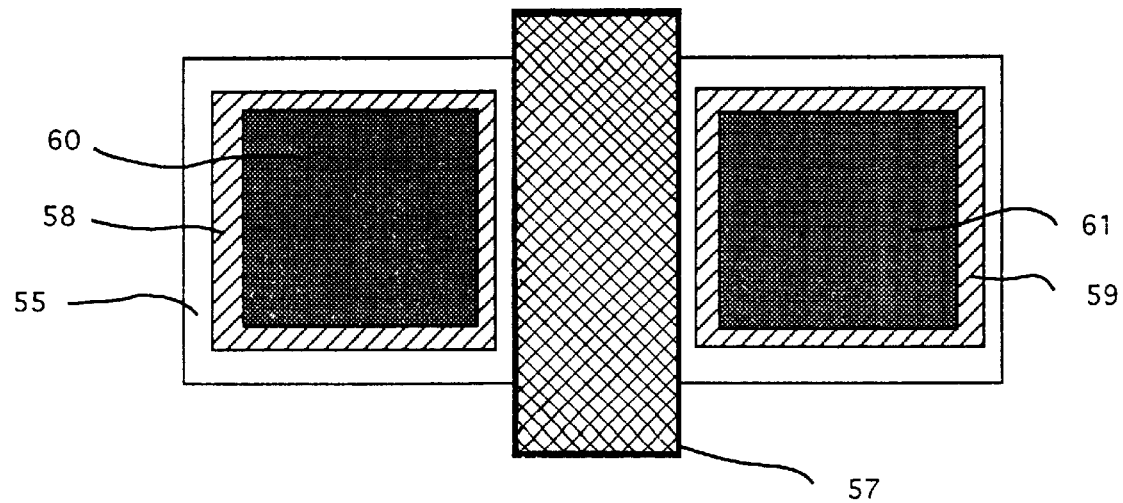
FIG. 6 is a plan view of the Graded CHANNEL HIGFET according to the first embodiment of the present invention.

It is important to ensure that the carriers do not spill into the lower mobility cap layer resulting in a parallel conduction process which will degrade device performance. This can be achieved by proper choice of the cap 53 layer thickness, e.g. 50–100 Å. As mentioned earlier the dielectric can be replaced by a higher bandgap resistive epitaxial insulator layer, e.g. strained or lattice matched InAlAs. This would require step 7(b) in the fabrication sequence while step 13 will not be required. In addition, for self aligned structures, interface control layer (step 12), dielectric deposition (step 13) and gate metal definition (step 14) will precede implantation in the mentioned order. Step 12 is an epitaxial interface engineering step. This can be used for example to minimize traps at the insulator/InP interface with a 30 Å GaP layer or increase the Schottky barrier height. Although the InP/InGaAs combination is indicated as the channel material any high mobility, lattice matched or strained ternary or quaternary alloy with a lattice matched or strained larger bandgap semiconductor can be used in the device fabrication. FIG. 6 shows a top view of the proposed HIGFET.

FET IR DETECTOR

Figure 7:
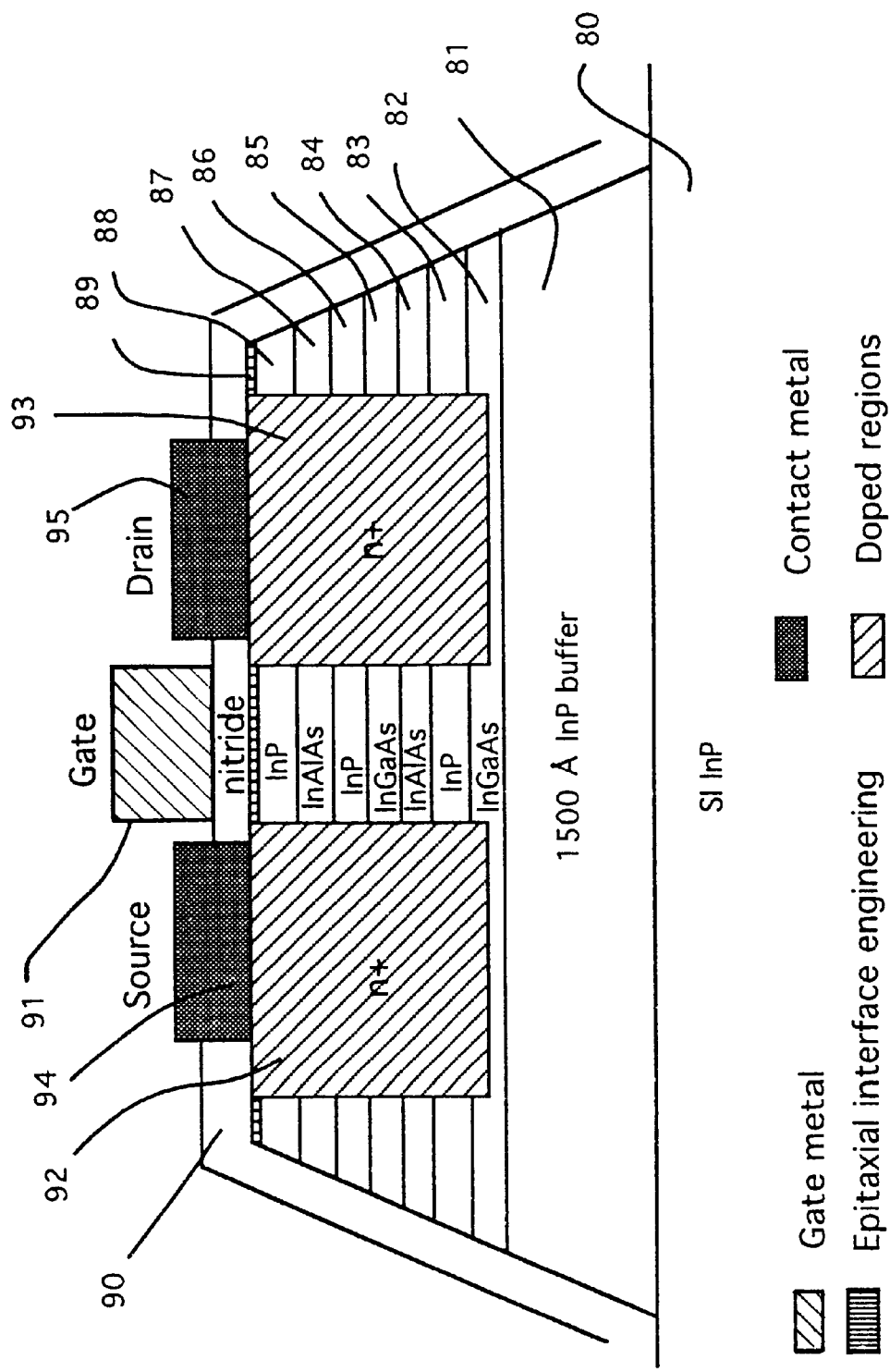
FIG. 7 is a cross-sectional view of the Infra-red FET RE detector according to the second embodiment of the present invention.

FIG. 7 shows the cross-section of the proposed heterojunction Infra-red detector. The device consists of:
a) A semi-insulating (SI) InP substrate (80).
b) A resistive buffer layer (81).
c) A lattice matched undoped lower bandgap epitaxial channel layer (82) (layer a).
d) A lattice matched larger bandgap undoped intermediate layer (83) (layer b) which provides appropriate conduction band discontinuity and a large differential mobility with respect to the lower bandgap layer a. The thickness of this layer is chosen to allow parallel conduction.
e) a large bandgap barrier layer (84) (layer c) which prevents carrier spill over.
f) A multiple cycle of the afore-mentioned layers a, b and c (85, 86 and 87).
g) An optional cap InP layer (88).
h) An interface control layer, e.g. 20 Å GaP layer (89).
i) An optional dielectric layer 90).
j) Dopant implanted charge supplying source and drain regions (92 and 93).
k) A refractory gate which controls the sampling rate (91).
l) Contacts 94 and 95 to the implanted region (92 and 93).
m) Device isolation.

Figure 8A:
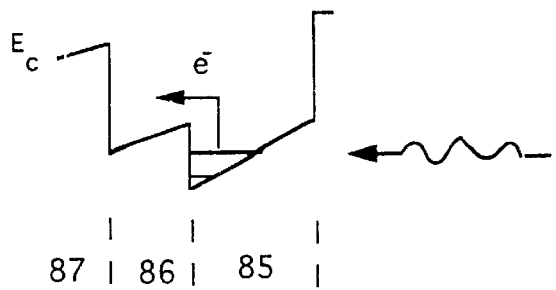
FIG. 8a is a schematic of the steady state conduction band edge energy band diagram for one cycle of the three layers described earlier namely, (a) 2DEG layer, (b) intermediate layer and (c) barrier layer for the FET IR detector according to the second embodiment of the present invention.
Figure 8B:
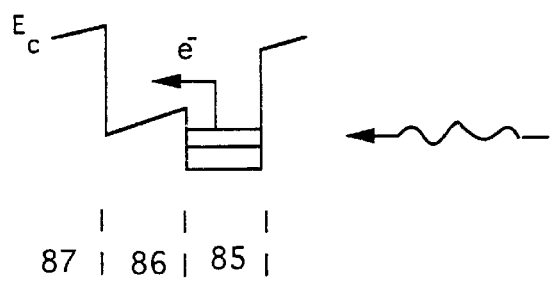
FIG. 8b is a schematic of the steady state conduction band edge energy band diagram for one cycle of the three layers described earlier namely, (a) 2DEG quantum well layer, (b) intermediate layer and (c) barrier layer for the quantum well FIRE detector according to the second embodiment of the present invention.

Although we have indicated the InGaAs/InP/InAlAs system, any material combination which provides adequate $\Delta E_c$ barrier, mobility difference and a suitable large bandgap barrier can be used. The device is similar to the conventional Schottky barrier detector with the electron gas acting as a metal in contact with a barrier ($\Delta E_c$). FIGS. 8a and 8b explain device operation: an appropriate positive voltage applied to the gate will cause charge injection from the implanted region(s) into the lower bandgap semiconductor resulting in the formation of a 2 dimensional electron gas (2DEG) in layer (a) due to the $\Delta E_c$ barrier. The hot electrons produced by the interaction of the photons with the electron gas will be emitted over the $\Delta E_c$ barrier due to the field created by the gate electrode. These electrons can be detected by either of the two methods described below.

Figure 9:
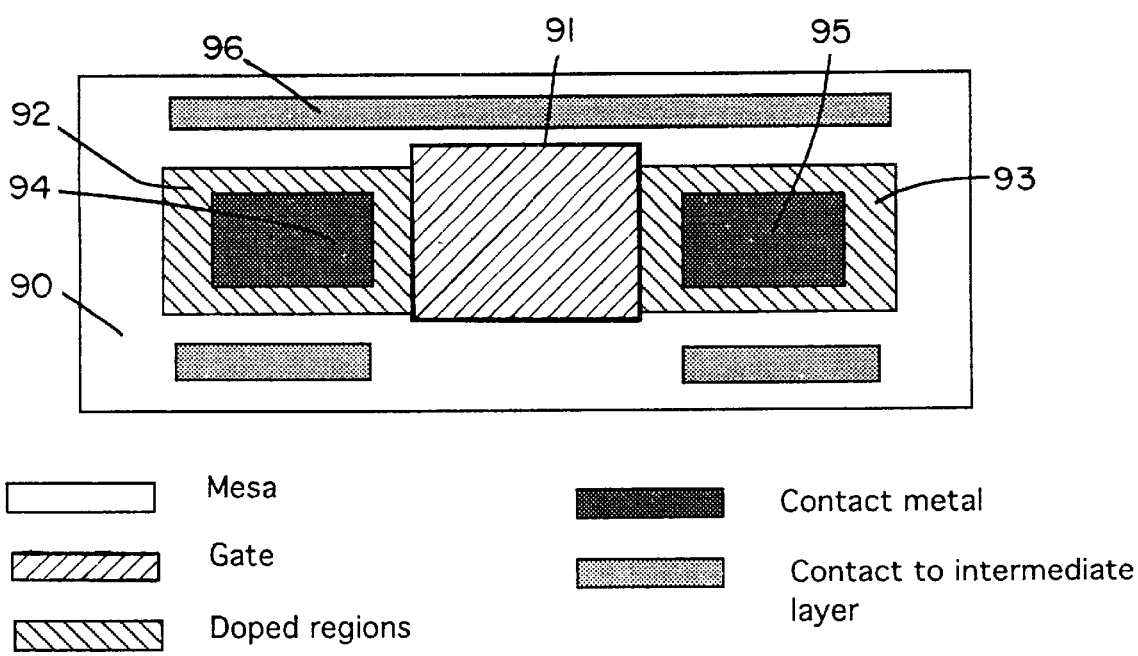
FIG. 9 is a top view of the FET Infra-red detector providing the contact scheme according to the second embodiment of the present invention.

In the first case, the device is operated like a FET with a low bias between source and drain. Here, emission of electrons from the higher mobility lower bandgap channel layer (a) into the lower mobility intermediate layer (b) will cause parallel conduction through the device thereby reducing the overall mobility and will show up a variation in the drain current. This naturally requires that we have a large mobility difference between the 2DEG and intermediate layers and the possibility of parallel conduction. In the second case the electrons emitted into the layer (b) are collected by providing suitable contacts to this layer. This case is illustrated in FIG. 9. Here the implanted regions are at the same potential and only serve to supply charge by injection into the lower potential region under the gate. The layer (b) contacts should be spaced and biased suitably to collect the electrons spilling over the barrier. The most interesting property of this device is that a large range of $\Delta E_c$ can be achieved by proper choice of materials and alloy compositions. This can be used to alter the cut-off and operating wavelength of the device and to fine tune the device response. Similarly multiple cycles of the three layers, as shown in FIG. 7, can be used to increase the detector response. Another interesting aspect is the thickness of the 2DEG. It is well known for conventional Schottky barrier detectors that use of thin metal layers 20–100 Å increases the quantum efficiency coefficient due to an enhancement in the internal photo emission process. This is mainly due to diffuse scattering of hot electrons from the back wall of the electrode that add to the emission current. In the case of the FIRE detector, the thickness of the 2DEG "metal layer" is a few tens of angstroms and the carriers will undergo quantum mechanical reflection at the potential well barrier similar to scattering effects in thin films. This is expected to result in a high quantum efficiency FIRE detector. Moreover the thickness of the 2DEG can be varied by replacing layer (a) with a quantum well as shown in FIG. 8b. In addition the gate metal acting as a mirror will serve to efficiently couple the signal to the 2DEG. Using epitaxial interface engineering layers viz. 30 Å GaP will reduce the surface states at the top interface in the case of conventional insulators and increase the Schottky barrier height for epitaxial insulators.

The advantage of the FET IR (FIRE) detector over conventional ones is the use of a gate to control the signal sampling rate by controlling the 2DEG formation. In the non-sampling state the gate will completely deplete the active area. Since no current flows through the device in this state, problems associated with dark current will be eliminated and the detector is expected to operate without cooling or at higher temperatures than conventional detectors. Moreover use of high mobility semiconductors will result in higher operating frequencies. Since the intrinsic materials are large bandgap semiconductors, the device can be operated at fields much larger than conventional small bandgap detectors.

Device fabrication is identical to the HIGFET previous case except the epitaxial regrowth steps (3, 4, 5 and 6) are not required. In addition a material selective etching sequence will be incorporated to contact the intermediate layers. Self alignment is not expected to be of any significant advantage for these devices.

Although several embodiments have been described, this was for the purpose of illustrating, but not limiting, the invention. Various modifications, which will come readily to the mind of one skilled in the art, are within the scope of the invention as defined in the appended claims.

We claim:

1. A FET device, comprising;
    a source region;
    a drain region;
    a channel region interconnecting said source region and said drain region, and provided under a gate;
    said channel region comprising adjacent said source region a first portion having at least one of a higher bandgap energy and a lower electron affinity than a second portion extending between said first portion to said drain region, whereby
        a quasi-electric field in said channel region near said source region is created in order to accelerate charge carriers and increase switching speed.

2. A FET device as defined in claim 1, wherein said device is a heterojunction insulated gate field effect transistor (HIGFET) comprising a high resistivity III–V semiconductor substrate having a pair of opposed surfaces;
    said channel region comprising:
        a low bandgap high mobility epitaxial channel layer deposited on one surface of said substrate;
        a large bandgap epitaxial barrier layer deposited on top of said channel layer;
        an interface control layer deposited on top of said barrier layer;
        said gate comprising a gate electrode deposited on top of said interface control layer;
        said source region and said drain region being doped and extending below said interface control layer through said barrier layer and into said channel layer;
        a drain electrode connected to said drain region and a source electrode connected to said source region.

3. A FET device as defined in claim 1, wherein said first portion is graded to have at least one of a varying bandgap energy and a varying electron affinity close to that of said source region near said source region and close to that of said second portion of said channel region near said second portion.

4. A FET device as defined in claim 3, wherein said first portion comprises an epitaxial layer deposited on a wedge extension of said second portion, whereby said varying bandgap energy or said varying electron affinity of said first portion results from varying proportions of said epitaxial layer and said extension between said source region and said second portion.

5. A FET device as defined in claim 4, wherein said device is a heterojunction insulated gate field effect transistor (HIGFET) comprising a high resistivity III–V semiconductor substrate having a pair of opposed surfaces;
    said channel region comprising:
        a low bandgap high mobility epitaxial channel layer deposited on one surface of said substrate;
        a large bandgap epitaxial barrier layer deposited on top of said channel layer;
        an interface control layer deposited on top of said barrier layer;
        said gate comprising a gate electrode deposited on top of said interface control layer;
        said source region and said drain region being doped and extending below said interface control layer through said barrier layer and into said channel layer;
        a drain electrode connected to said drain region and a source electrode connected to said source region.

6. A FET device as defined in claim 3, wherein said device is a heterojunction insulated gate field effect transistor (HIGFET) comprising a high resistivity III–V semiconductor substrate having a pair of opposed surfaces;
    said channel region comprising:
        a low bandgap high mobility epitaxial channel layer deposited on one surface of said substrate;
        a large bandgap epitaxial barrier layer deposited on top of said channel layer;
        an interface control layer deposited on top of said barrier layer;
        said gate comprising a gate electrode deposited on top of said interface control layer;
        said source region and said drain region being doped and extending below said interface control layer through said barrier layer and into said channel layer;
        a drain electrode connected to said drain region and a source electrode connected to said source region.

7. A HIGFET as defined in claim 6 and including a buffer layer disposed between said substrate and said channel layer.

8. A HIGFET as defined in claim 7 wherein said channel layer has a higher electron affinity than said buffer layer.

9. A HIGFET as defined in claim 8 wherein said barrier layer has a smaller electron affinity than said channel layer.

10. A HIGFET as defined in claim 9 and including a dielectric layer deposited on said interface control layer.

11. A HIGFET as defined in claim 10 having a mesa construction.

12. A HIGFET as defined in claim 11 wherein said substrate comprises a semi-insulating material comprising (SI) InP.

13. A HIGFET as defined in claim 12 wherein said buffer layer comprises InAlAs.

14. A HIGFET as defined in claim 11 wherein said channel layer comprises InGaAs.

15. A HIGFET as defined in claim 14 wherein said first portion of said channel layer comprises $In_{1-x}Ga_xAs$; wherein $x \geq 0.47$.

16. A HIGFET as defined in claim 15 wherein said barrier layer comprises InP.

17. A HIGFET as defined in claim 16 wherein said epitaxial interface control layer comprises a 20 Å strained GaP epitaxial layer.

18. A HIGFET as defined in claim 1 wherein said dielectric layer comprises $SiO_2$.

19. A HIGFET as defined in claim 18 wherein said source and drain regions comprise highly doped ($n^+$) materials.

20. A HIGFET as defined in claim 19 wherein said gate comprises a metal selected from the group of W, Ti or Pt.

21. A HIGFET as defined in claim 20 wherein said drain and source electrodes are selected from Au, Ge or Ni.

22. A FET device as defined in claim 3 wherein said first portion is graded by providing a composition which varies in a linear fashion such that it decreases the electron affinity towards said source region.

23. A FET device as defined in claim 22, wherein said device is a heterojunction insulated gate field effect transistor (HIGFET) comprising a high resistivity III–V semiconductor substrate having a pair of opposed surfaces;

said channel region comprising:

a low bandgap high mobility epitaxial channel layer deposited on one surface of said substrate;

a large bandgap epitaxial barrier layer deposited on top of said channel layer;

an interface control layer deposited on top of said barrier layer;

said gate comprising a gate electrode deposited on top of said interface control layer;

said source region and said drain region being doped and extending below said interface control layer through said barrier layer and into said channel layer;

a drain electrode connected to said drain region and a source electrode connected to said source region.

24. A FET as defined in claim 1, wherein said channel region is sufficiently short to reduce the probability of collisions as charge carriers flow through said channel region, whereby an accelerated speed of charge carriers by said intensified quasi-electric field is substantially maintained across said channel region thereby further increasing switching speed.

25. A FET as defined in claim 1, further comprising a barrier layer deposited on said channel region, said gate being provided directly on said barrier layer, whereby said FET is an HFET.

* * * * *